(12) United States Patent
Matsumura (10) Patent No.: US 10,148,074 B1
(45) Date of Patent: Dec. 4, 2018

(54) JUNCTION BOX ASSEMBLY WITH REMOVABLE CONNECTOR SUPPORT

(71) Applicant: Sumitomo Wiring Systems, Ltd., Yokkaichi-shi, Mie (JP)

(72) Inventor: Akihiro Maximilian Matsumura, Farmington Hills, MI (US)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days.

(21) Appl. No.: 15/910,704

(22) Filed: Mar. 2, 2018

(51) Int. Cl.
*H05K 5/00* (2006.01)
*H02G 3/08* (2006.01)
*H05K 5/02* (2006.01)

(52) U.S. Cl.
CPC ........... *H02G 3/083* (2013.01); *H05K 5/0013* (2013.01); *H05K 5/0221* (2013.01); *H05K 5/0234* (2013.01)

(58) Field of Classification Search
CPC .................................................. H05K 5/0221
See application file for complete search history.

(56) References Cited

U.S. PATENT DOCUMENTS

| | | | |
|---|---|---|---|
| 5,253,143 A | 10/1993 | Klinger et al. | |
| 5,777,843 A | 7/1998 | Younce | |
| 5,795,193 A | 8/1998 | Yang | |
| 7,077,711 B1 | 7/2006 | Moore | |
| 8,723,038 B2 | 5/2014 | Sakai et al. | |
| 8,961,198 B2 | 2/2015 | Ferran Palau et al. | |
| 8,961,245 B2 | 2/2015 | Kowtun | |
| 2012/0015531 A1* | 1/2012 | Chiba | H01R 12/675 439/76.2 |

* cited by examiner

*Primary Examiner* — Hung V Ngo
(74) *Attorney, Agent, or Firm* — Honigman Miller Schwartz and Cohn LLP (57) ABSTRACT

A junction box assembly configured to provide access to a floor of the bottom cover without having to disconnect the connector assembly is provided. The junction box assembly includes a removable connector support. The connector support is configured to hold a connector assembly. The connector support is removably attached to a bottom cover so as to provide access to a floor of the bottom cover. In one embodiment, the connector support is rotatably attached to a bottom cover of the junction box assembly so as to move between an open position and a closed position, wherein in the closed position a floor of the bottom cover is covered and in the open position the floor is exposed.

18 Claims, 12 Drawing Sheets

JUNCTION BOX ASSEMBLY WITH REMOVABLE CONNECTOR SUPPORT

TECHNICAL FIELD

The present specification generally relates to junction box assemblies, and more particularly to electric junction box assemblies having a power distribution box and connector assemblies, wherein the connector assemblies may be moved so as to access a bottom cover.

BACKGROUND

In general, electric junction box assemblies include a power distribution box for storing electric components configured to regulate power to various electric components. Generally stated, power is supplied to the power distribution box, wherein the power is regulated using commonly known components such as switches, relays, fuses, capacitors, resistors and the like. The regulated power is then supplied to selected electric components.

Figure 1A:
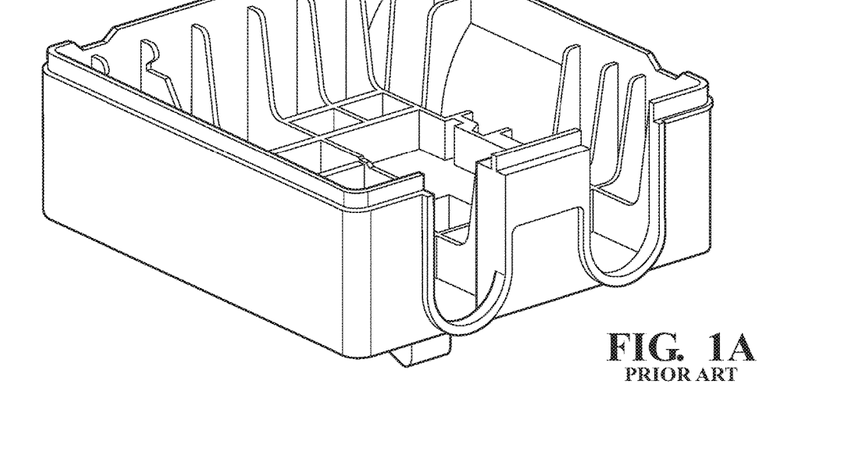
FIG. 1A schematically depicts a prior art bottom cover for use in a junction box assembly.
Figure 1B:
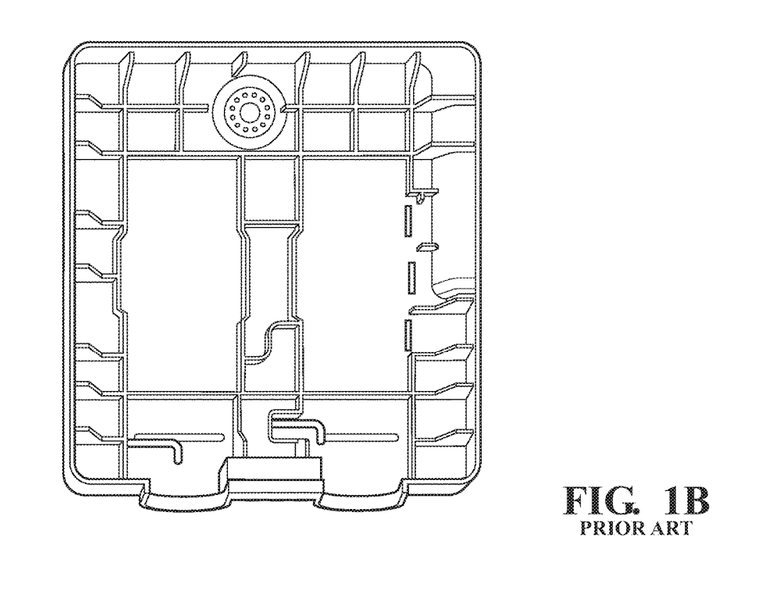
FIG. 1B is a top down view of the bottom cover shown in FIG. 1A.

The power distribution box is disposed over a bottom cover. The bottom cover includes a plurality of partitions for accommodating a connector assembly. FIG. 1 shows the partitions are integrally formed to a bottom floor of the bottom cover. Such a configuration does not provide access for other components and limits packaging options. For instance, an eyelet terminal having a busbar for providing an electrical connection to electrical components cannot be removed without removing the connector assembly.

In one embodiment, the connector support includes a retention hook configured to retain the connector assembly. The connector support includes a connector wall formed on the top surface of the base of the connector support. The connector wall forms a connector cavity configured to receive a respective connector assembly. The retention hook is disposed along the connector wall and is resiliently biased to engage and retain the connector assembly.

Accordingly, it remains desirable to have an electronic junction box assembly wherein the floor of the bottom cover may be accessed without having to disconnect the connector assembly.

SUMMARY

In one embodiment, a junction box assembly having a removable connector support is provided. The junction box assembly includes a housing having a top cover, a Power Distribution Box ("PDB") and a bottom cover. The top cover is configured to close the top of the PDB and the PDB is configured to be seated on top of the bottom cover. The junction box assembly further includes a connector support removably attached to the bottom cover and movable from a closed position to an open position, wherein in the open position, a floor of the bottom cover is exposed. The connector support is configured to hold at least one connector assembly.

In one embodiment, the connector support is rotatably coupled to the inner surface of the floor of the bottom cover. For instance, the connector support may include a gripper disposed on an under surface of the connector support. The bottom cover includes a shaft coupled to the inner surface of the floor of the bottom cover, wherein the gripper is configured to grip the shaft so as to rotate the connector support about the shaft, moving the connector support between the open position and the closed position.

In one embodiment, the connector support includes a latch mechanism. The latch mechanism is configured to secure the connector support to the bottom cover when the connector support is in the closed position. For instance, the latch mechanism may be disposed on a front wall of the connector support. The latch is formed of a resilient member configured to engage a lip disposed within the bottom cover. The latch mechanism may be pressed so as to release the latch mechanism from the lip when moving the connector support from the closed to the open position.

In one embodiment, the connector support includes an open retention feature. The open retention feature is configured to keep the connector support in the open position. For instance, the open retention feature may be at least one nub. The nub is disposed on a back wall of the connector support. The floor of the bottom cover includes a receiving aperture, wherein the nub is registered to engage the receiving aperture in a press-fit engagement when the connector support is in the open position. Accordingly, the retention feature helps keep the connector support in an open position.

In one embodiment, the junction box assembly includes a reinforcement feature. The reinforcement feature is configured to help prevent the connector support from detaching from the bottom cover. In one aspect of the reinforcement feature, the reinforcement feature includes a stop disposed on an outer surface of a stand. An end wall includes a catch disposed on an inner surface of the end wall, the end wall spaced apart from the gripper so as to receive the stand. The catch is configured to be positioned underneath the stop when the connector support is in the closed position.

In one embodiment, the connector support includes a water mitigation feature wherein the bottom cover includes an eyelet terminal opening and an eyelet terminal support. The eyelet terminal support is disposed on an inner surface of the floor of the bottom cover. The eyelet terminal opening is bound along the sides by a partition. The partition is generally orthogonal to the floor and includes an eyelet terminal portion having a busbar opening for receiving a busbar.

The water mitigation feature includes an eyelet terminal cover having a back support wall and a pair of side support walls. A hood covers the top of the back support wall and includes a pair of hood walls spaced apart from respective side support walls so as to fittingly receive opposite portions of the partition bounding the sides of the eyelet terminal opening. Accordingly, the eyelet terminal opening is closed so as to prevent water from entering the bottom cover.

Accordingly, the junction box assembly is configured to house a connector assembly yet provide access to the floor of the bottom cover without having to disconnect the connector assembly.

BRIEF DESCRIPTION OF THE DRAWINGS

The embodiments set forth in the drawings are illustrative and exemplary in nature and not intended to limit the subject matter defined by the claims. The following description of the illustrative embodiments can be understood when read in conjunction with the following drawings, where like structure is indicated with like reference numerals and in which:

DETAILED DESCRIPTION

Referring generally to the figures, embodiments of the present disclosure include a junction box assembly having a removable connector support. The connector support is configured to hold a connector assembly. The connector support is removably attached to a bottom cover so as to provide access to a floor of the bottom cover.

As used herein the terms front and back are made in reference to the orientation of the related part when the retaining system is assembled, wherein the front refers to the portion of the part facing the other during assembly and the back refers to the portion of the part facing away from the front. The term top and bottom refer to the orientation of the part as shown in the figures.

Figure 2:
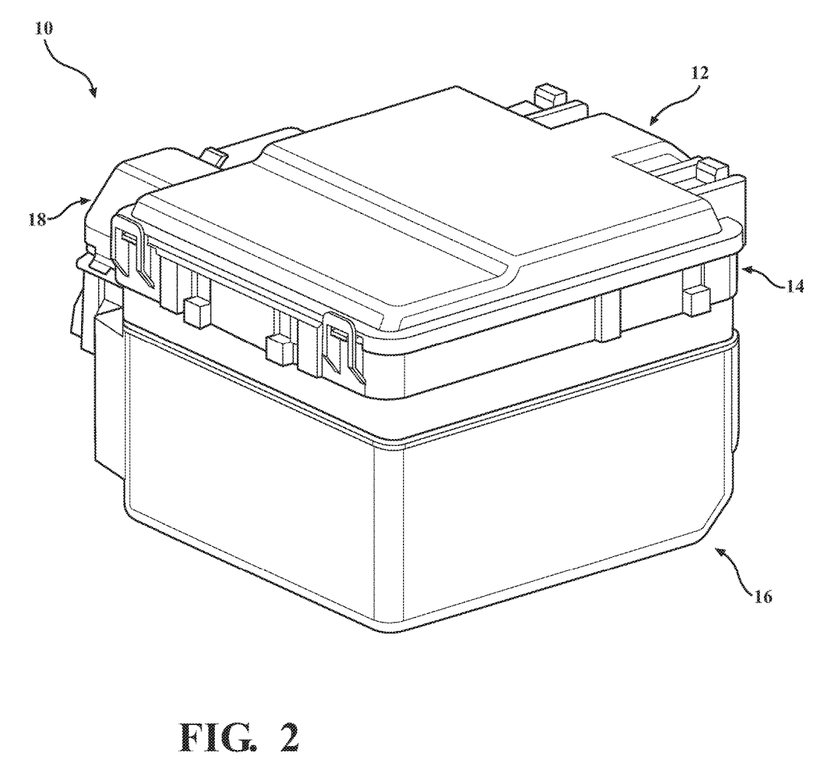
FIG. 2 schematically depicts a junction box assembly according to one or more embodiments illustrated herein.

With reference now to FIG. 2, an illustrative embodiment of a junction box assembly 10 is provided. The junction box assembly 10 includes a top cover 12, a Power Distribution Box ("PDB") 14 and a bottom cover 16. The top cover 12, PDB 14 and bottom cover 16 are releasably coupled to each other using a known conventional latching mechanism. The junction box assembly 10 may include an eyelet terminal housing 18 disposed on an exterior of the junction box assembly 10. The junction box assembly 10 may be formed of a durable material adaptable for use in an injection molding process, illustratively including polypropylene.

Figure 14:
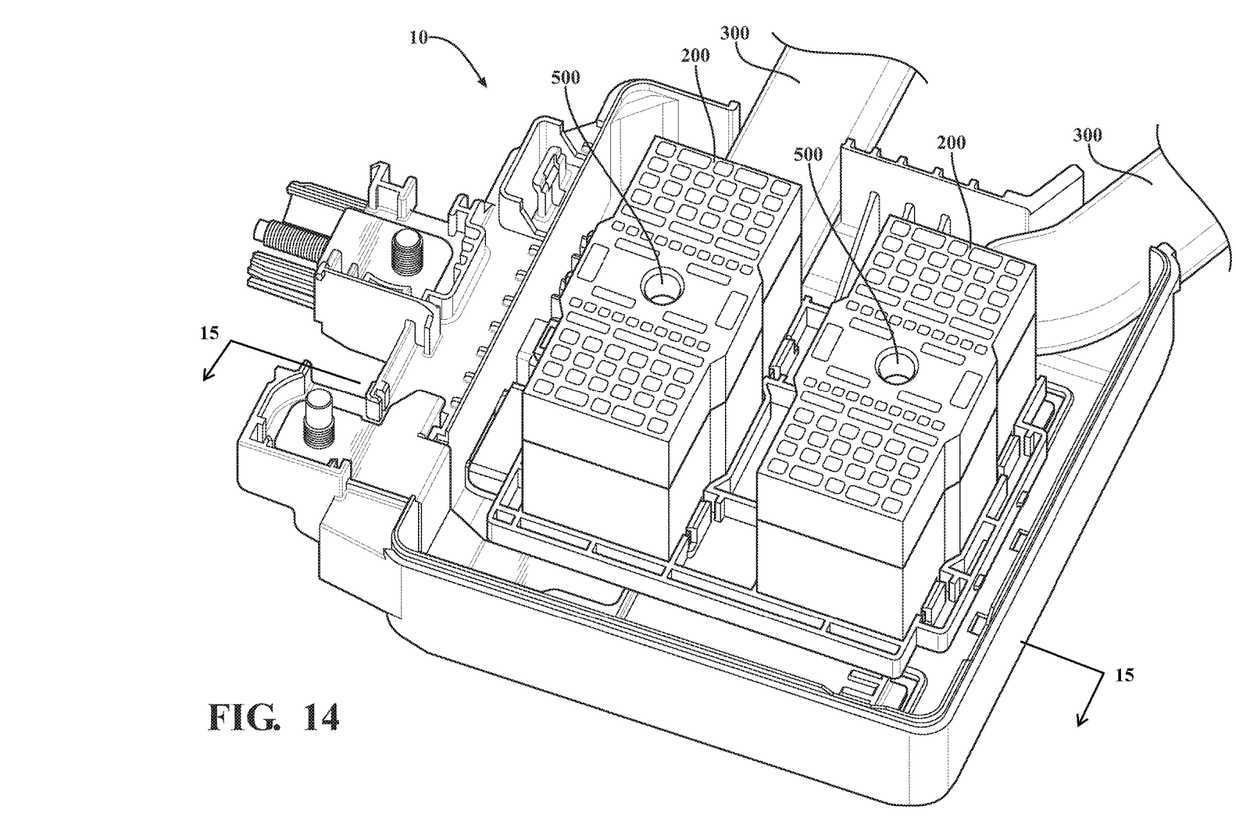
FIG. 14 is a perspective view showing connector assemblies disposed on the connector support.

The junction box assembly 10 receives power from a power source, or in this case two different power sources. The junction box assembly 10 is configured to direct power from the power source(s) to various electric devices (not shown). The junction box assembly houses a connector assembly 200, as shown in FIG. 14. The connector assembly 200 houses a terminal connection wherein wires 300 routed from the connector assembly 200 are in electrical communication with a respective electrical device(s).

Figure 3:
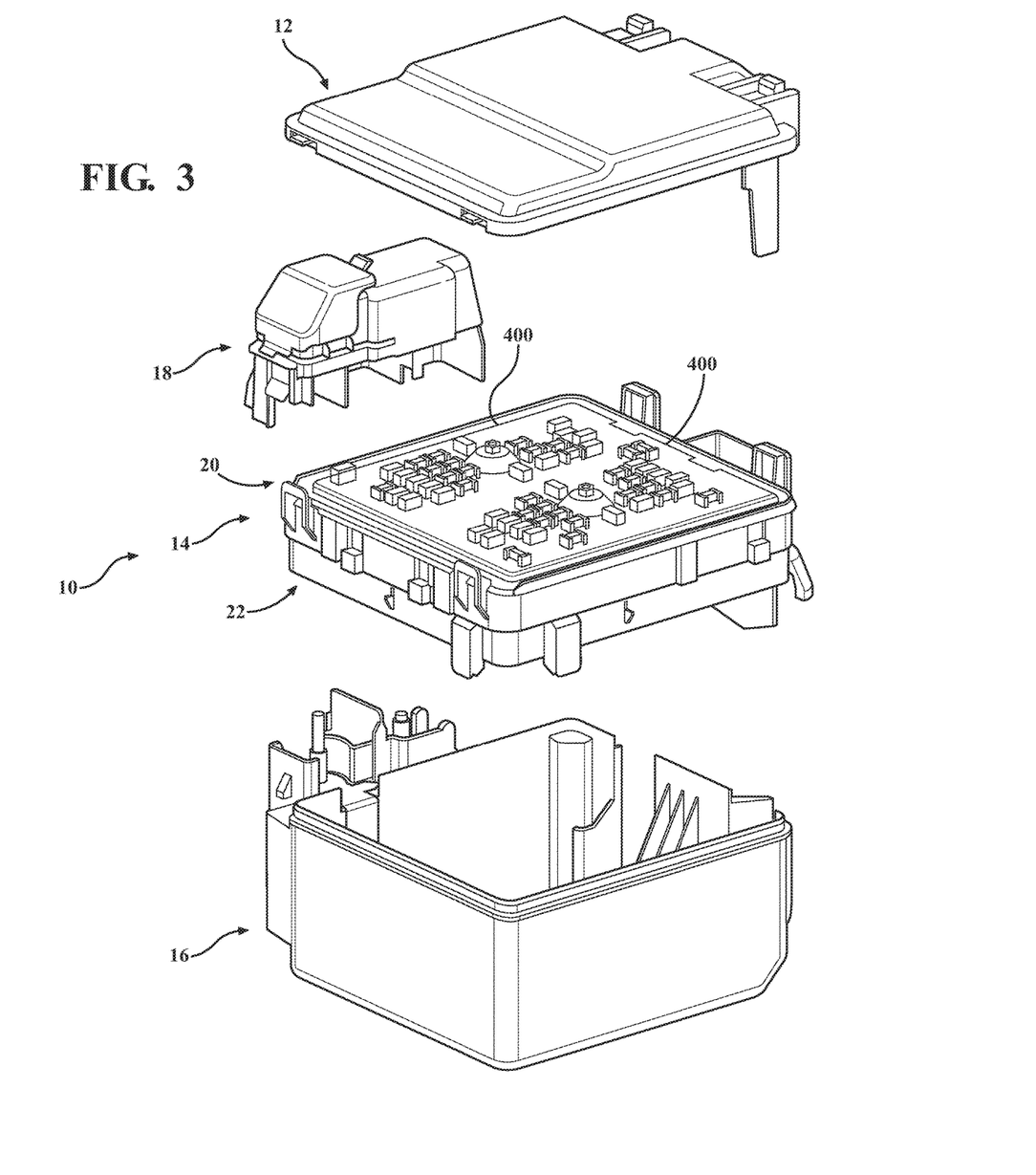
FIG. 3 is an exploded view of the junction box assembly shown in FIG. 2.

With reference now to FIG. 3, an exploded view of the junction box assembly 10 is provided. The PDB 14 includes a PDB top cover 20 and a PDB bottom cover 22. The PDB top cover 20 is releasably attached to the PDB bottom cover 22. The PDB bottom cover 22 is configured to store electric components configured to route electric signals to a plurality of relays and switches. The relays and switches are shown mounted on the top surface thereof. The PDB bottom cover 22 closes the bottom cover 16.

Figure 4:
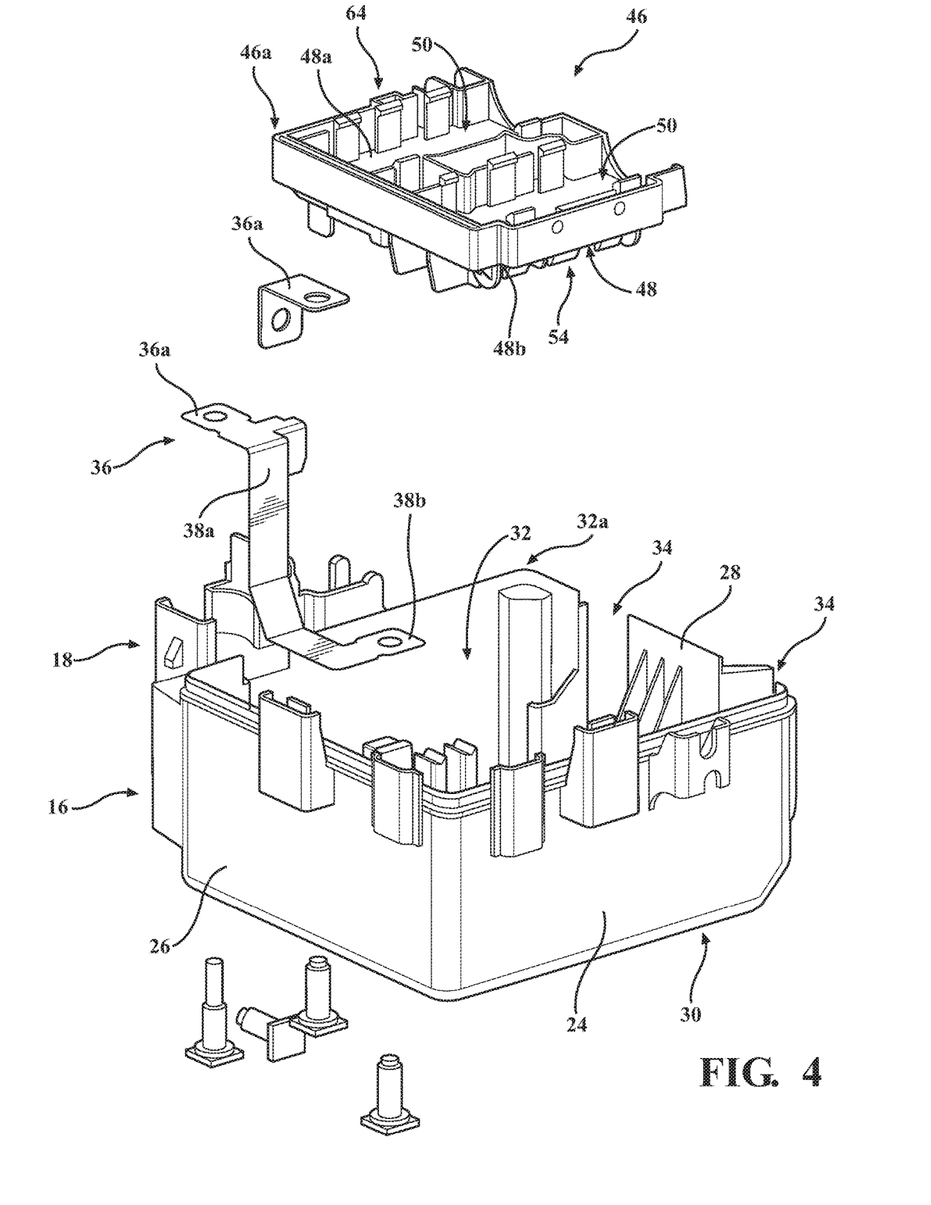
FIG. 4 is an exploded view of the bottom cover assembly shown in FIG. 3.

With reference now to FIG. 4, an exploded view of the bottom portion of the junction box assembly 10 is provided. The bottom cover 16 is generally cubic and includes a pair of first side walls 24, a first front wall 26 and a first back wall 28. A bottom floor 30 closes the bottom of the bottom cover 16 so as to define a bottom cover cavity 32 having an open top 32a.

The first back wall 28 includes a pair of wire openings 34 configured to receive wires 300 through which electric signals are carried. The eyelet terminal housing 18 is shown disposed on one of the first side walls 24. The eyelet terminal housing 18 houses an eyelet terminal 36 for receiving power. In this particular embodiment, the junction box assembly 10 includes a pair of exterior eyelet terminals 36a so as to provide power from two different power sources such as a 12 volt and 48 volt source and an interior eyelet terminal 36b for routing power to another load. The junction box assembly 10 may further include a pair of busbars 38a, 38b. One of the busbars 38a is configured to provide power from one of the exterior eyelet terminals 36a to the interior eyelet terminal 36b disposed in the bottom cover 16 cavity.

Figure 5:
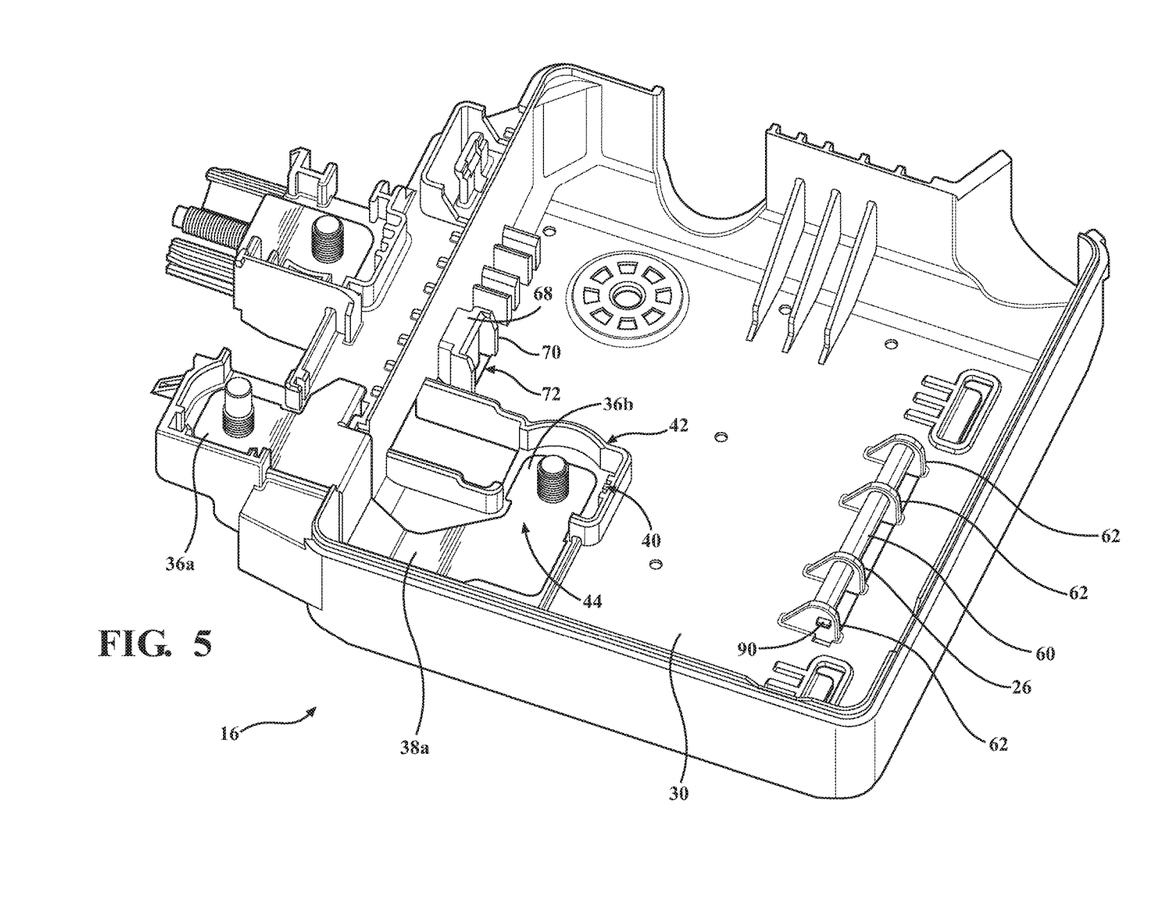
FIG. 5 is an isolated view of a bottom cover according to one or more embodiments described and illustrated herein.

With reference now to FIG. 5, a top down view of the bottom cover 16 is provided. The bottom floor 30 of the bottom cover 16 is a generally planar surface. The bottom floor 30 includes an eyelet terminal opening 40 for providing access to the interior eyelet terminal 36b. The eyelet terminal opening 40 is bound along the sides by a partition 42. The partition 42 is generally planar member that is orthogonal to the bottom floor 30 and includes an eyelet terminal portion having a busbar opening 44 for receiving the busbar 38a. The busbar 38a connects the interior eyelet terminal 36b to the exterior eyelet terminal 36a.

Figure 6:
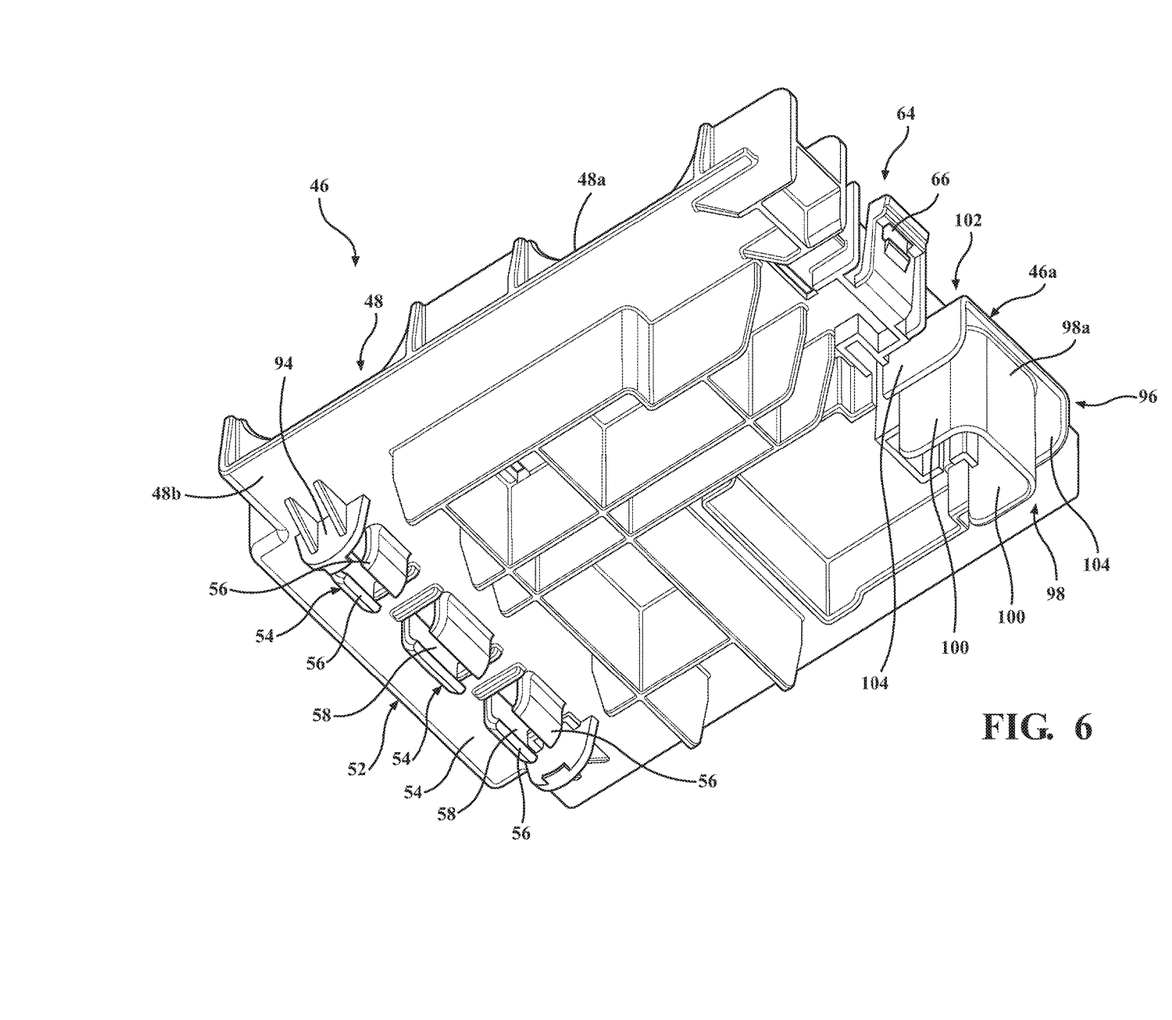
FIG. 6 is an isolated view of the connector support taken from the bottom.
Figure 7:
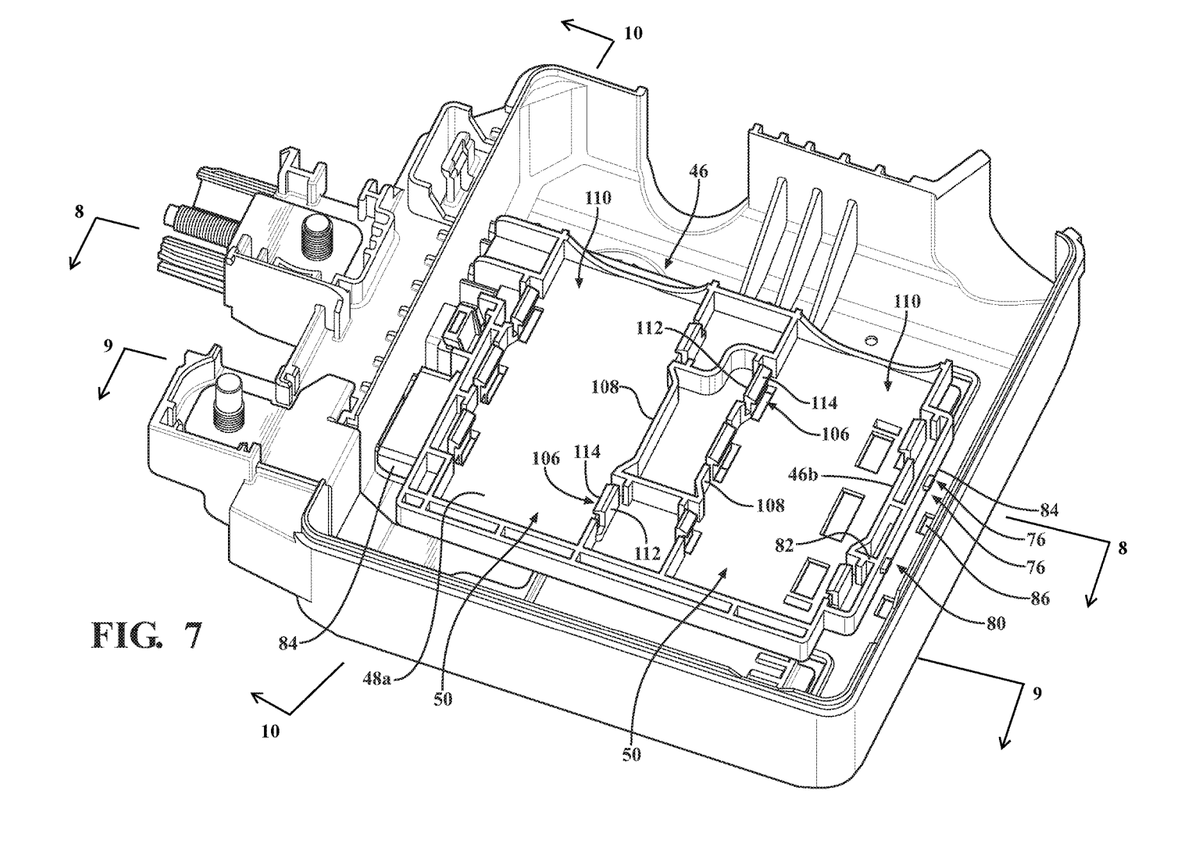
FIG. 7 is a view showing the connector support in the closed position and mounted within the bottom cover.
Figure 11:
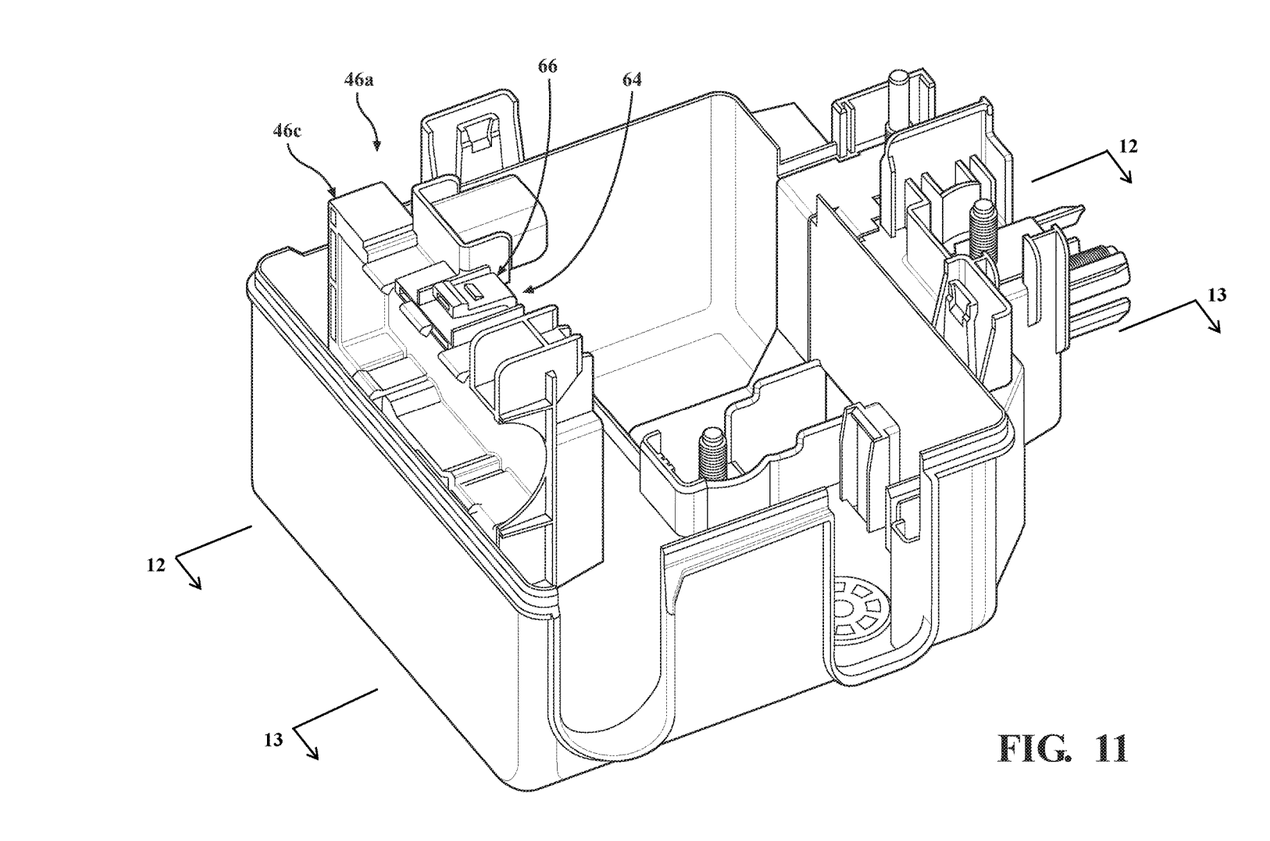
FIG. 11 is a view showing the connector support in the open position and mounted within the bottom cover.

With reference again to FIG. 4 and now to FIGS. 6, 7 and 11, the junction box assembly 10 further includes a connector support 46. The connector support 46 is removably attached to the bottom cover 16. The connector support 46 is configured to fit within the bottom cover cavity 32 so as to sit underneath a plane defined by the top edge of the first side walls 24, the first front wall 26 and the first back wall 28 of the bottom cover 16.

The connector support 46 includes a base 48. The base 48 is a generally planar member having a top surface 48a and a bottom surface 48b opposite of the top surface 48a. The top surface 48a includes a connector housing support 50. In this particular, embodiment, the connector support 46 includes a pair of connector housing supports 50 configured to hold a pair of connector assemblies 200. In one aspect, the bottom surface 48b of the connector support 46 includes a first attachment structure 52 configured to engage the bottom cover 16, wherein the first attachment structure 52 is configured to releasably engage the bottom cover 16 so to cover the bottom floor 30 of the bottom cover 16 in one instance, and expose the bottom floor 30 of the bottom cover 16 in the other instance.

In one aspect, the first attachment structure 52 is configured to rotatably attach the connector support 46 to the bottom cover 16. With reference again to FIGS. 6, 7 and 11 and now also to FIG. 5 an illustrative embodiment of the first attachment structure 52 is provided. The first attachment structure 52 is configured to rotate the connector support 46 between a closed position (shown in FIG. 7) and an open position (shown in FIG. 11).

In one aspect of the first attachment structure 52, the first attachment structure 52 includes a gripper 54 disposed on the bottom surface 48*b* of the connector support 46. The gripper 54 includes a pair of arms 56 spaced apart from each other so as to form a slot shaft 58. The arms 56 are resilient so as to open and close.

The bottom cover 16 includes a support shaft 60 coupled to the inner surface of the bottom floor 30 of the bottom cover 16. The gripper 54 is configured to grip the support shaft 60 so as to rotate the connector support 46 about the support shaft 60, moving the connector support 46 between the open position and the closed position. In a preferred embodiment, the first attachment structure 52 includes three grippers 54 spaced apart from each other along a common axis. The grippers 54 are coupled to the support shaft 60 by pressing the arms 56 onto the support shaft 60 along the slot shaft 58 of the gripper 54, opening the slot shaft 58 until the support shaft 60 passes the distal ends of the arms 56. The arms 56 are then free to close onto the support shaft 60.

The support shaft 60 is an elongated cylindrical member and is spaced apart from the bottom floor 30. The support shaft 60 is held in place by a plurality of stands 62. The stands 62 are generally planar members integrally formed to the bottom floor 30. For illustrative purposes, the first attachment structure 52 is shown having four stands 62. The stands 62 are spaced apart from each other so as to accommodate a respective gripper 54. Accordingly, the first attachment structure 52 is configured to allow the connector support 46 to rotate about the support shaft 60.

In one embodiment, connector support 46 includes a latch mechanism 64. The latch mechanism 64 is configured to secure the connector support 46 to the bottom cover 16 when the connector support 46 is in the closed position. In one aspect, the latch mechanism 64 is a resilient tab 66 formed on a front wall 46*a* of the connector support 46. The resilient tab 66 is a generally elongated member. A bottom portion of the resilient tab 66 is integrally formed to the front wall 46*a* of the connector support 46. A back surface 66*a* of the resilient tab 66 is spaced apart from the front wall 46*a* of the connector support 46.

Figure 8:
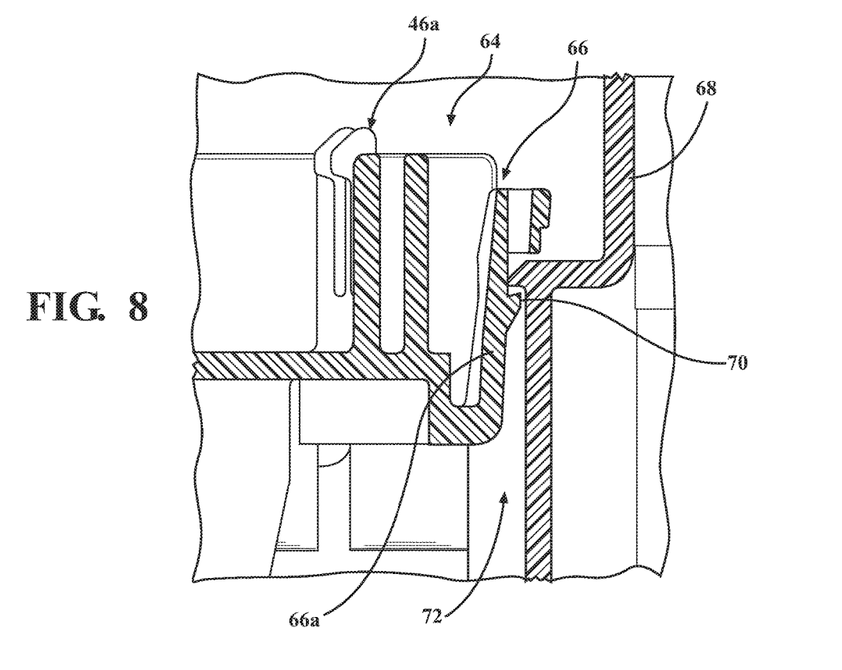
FIG. 8 is a cross-sectional view of FIG. 7 taken along line 8-8.

With reference again to FIG. 5 and now to FIG. 8, the bottom cover 16 further includes a key structure 68. The key structure 68 is configured to engage the resilient tab 66. The key structure 68 is formed on one of the first side walls 24 of the bottom cover 16. The key structure 68 is a generally planar member having a U-shaped cross-section. A lip 70 forms a top portion of the key structure and is disposed above a gap 72. The gap 72 is configured to receive a portion of the resilient tab 66.

FIG. 8 shows the resilient tab 66 engaging the lip 70 so as to secure the connector support 46 in a closed position, wherein a portion of the resilient tab 66 is disposed within the gap 72. Pulling the resilient tab 66 towards the front wall 46*a* disengages the latch mechanism 64 from the lip 70 so as to allow the connector support 46 to move to the open position.

Figure 13:
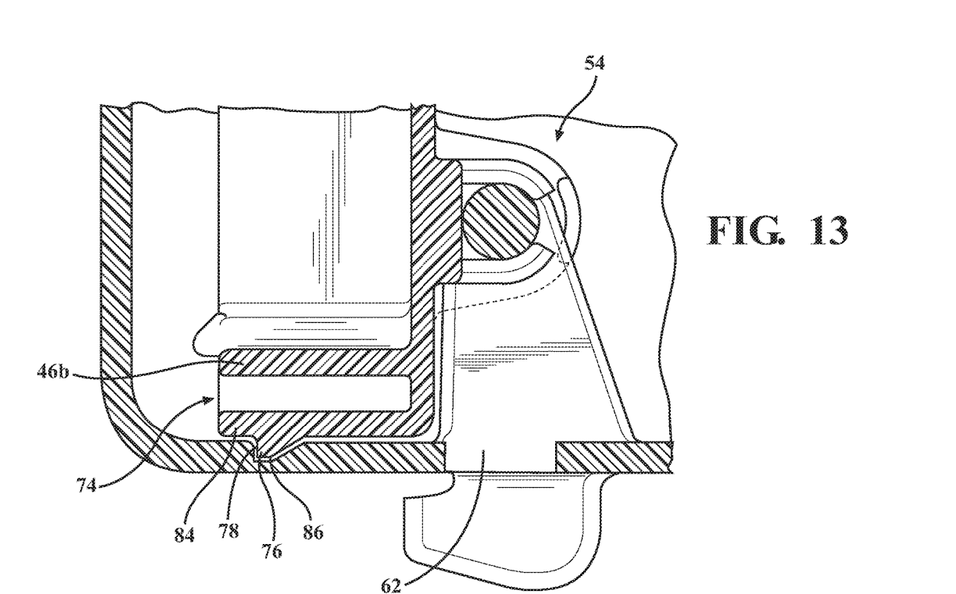
FIG. 13 is a cross-sectional view of FIG. 11 taken along line 13-13.

In one embodiment, the connector support 46 includes an open retention feature 74 as shown in FIGS. 7 and 13. The open retention feature 74 is configured to keep the connector support 46 in the open position. In one embodiment, the open retention feature 74 is a nub 76. The nub 76 is illustratively shown as a having a ramp shaped cross-section with a planar front edge 78 generally orthogonal to a back wall 46*b* of the connector support 46. The nub 76 is shown disposed on the back wall 46*b* of the connector support 46.

In one aspect, the back wall 46*b* of the connector support 46 includes a spacer 80. The spacer 80 includes a pair of legs 82 interconnected by a support wall 84 so as to space the support wall 84 away from the back wall 46*b* of the connector support 46. The nub 76 may be integrally formed on the support wall 84.

The bottom floor 30 of the bottom cover 16 includes a receiving aperture 86. The receiving aperture 86 is configured to receive and engage the nub 76 in a press-fit engagement when the connector support 46 is in the open position. The junction box assembly 10 is illustratively depicted as having a pair of nubs 76 and a pair of receiving apertures 86. However, it should be appreciated that the number of nubs 76 and receiving apertures 86 is provided for illustrative purposes, and that the retention feature 74 may contain only one nub 76 and one receiving aperture 86 or more than two of each.

As shown in FIG. 13, the legs 82 are configured to position the support wall 84 a predetermined distance from the back wall 46*b* so as to be generally flush with the bottom floor 30 of the bottom cover 16 when the connector support 46 is in the open position. The ramp shape dimension of the nub 76 helps facilitate entry of the nub 76 into the receiving aperture 86, wherein the planar front edge 78 of the nub 76 engages a flat surface defining the receiving aperture 86. Accordingly, the open retention feature 74 helps keep the connector support 46 in an open position by having the planar surface of the support wall 84 rest upon the planar surface of the bottom floor 30 and the press-fit engagement of the nub 76 within the receiving aperture 86. In particular, the open retention feature 74 is configured to keep the connector support 46 generally upright.

In one embodiment, the junction box assembly 10 includes a reinforcement feature 88. The reinforcement feature 88 is configured to help prevent the connector support 46 from detaching from the bottom cover 16. In particular, the reinforcement feature 88 is configured to retain the connector support 46 to the bottom cover 16 when a bolt 400 is secured to the connector assembly. In particular, the PDB 14 includes a pair of bolts 400, shown in FIG. 3. The bolts 400 are threaded into bores 500 of the connector assemblies 200, shown in FIG. 14. As the bolts 400 engage the connector assemblies 200, the connector assemblies 200 may be lifted, carrying the connector support 46. The reinforcement feature 88 is configured to help prevent the connector support 46 from separating from the bottom cover 16.

In one embodiment, the reinforcement feature 88 includes a stop 90. The stop 90 is disposed on an outer surface of the stand 62. The reinforcement feature 88 further includes a catch 92 disposed on an inner surface of an end wall 94. The end wall 94 is spaced apart from a respective gripper 54 so as to bound the ends of the support shaft 60. The end wall 94 is spaced apart from the respective gripper 54 so as to receive a corresponding stand 62 between the inner surface of the end wall 94 and the corresponding gripper 54.

Figure 9:
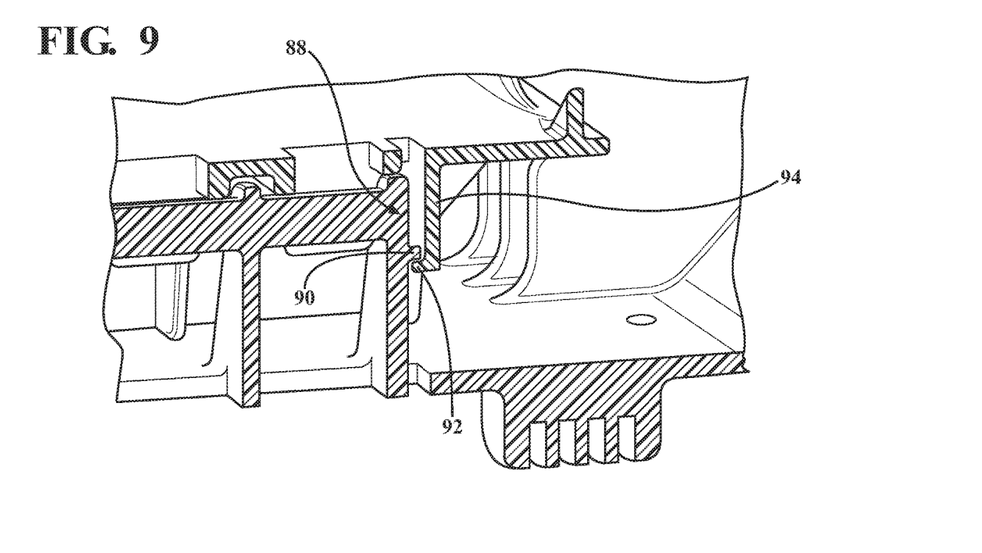
FIG. 9 is a cross-sectional view of FIG. 7 taken along line 9-9.
Figure 12:
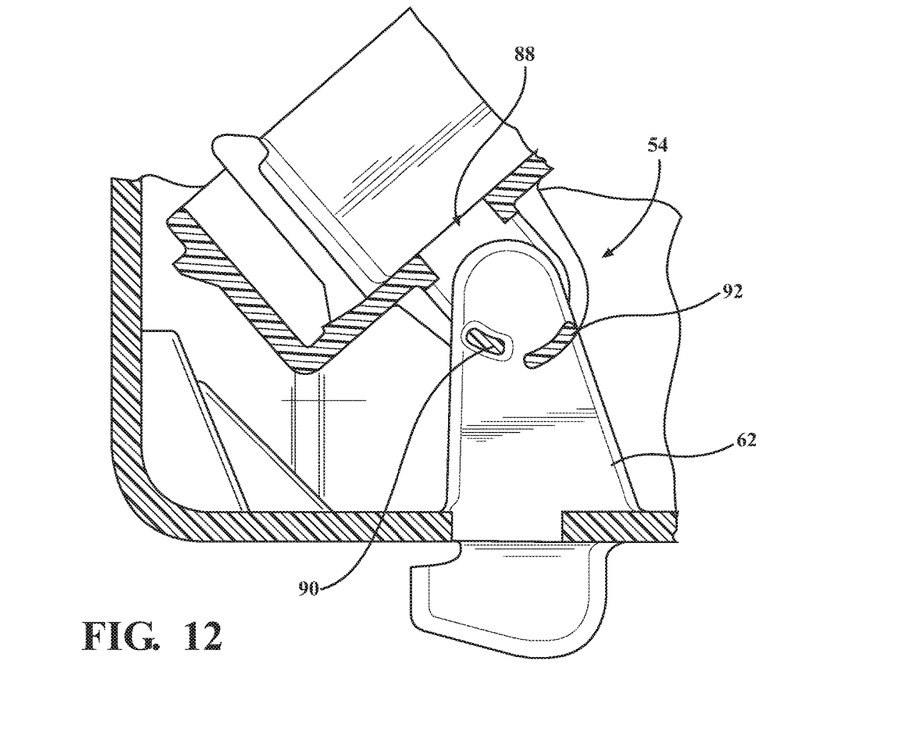
FIG. 12 is a cross-sectional view of FIG. 11 wherein the connector support is positioned between the open position and the closed position taken along line 12-12.

The catch 92 is disposed on the inner surface of the end wall 94 and is configured to be positioned underneath the stop 90 when the connector support 46 is in the closed position, as shown in FIG. 9. When the connector support 46 is moved to the open position, the stop 90 is cleared of the catch 92 so as to allow the connector support 46 to be removed, as shown in FIG. 12. However, as the catch 92 is disposed underneath the stop 90, the catch 92 will engage the stop 90, helping to withstand the pulling force applied to the connector support 46 when the bolt 400 is bolted into the respective connector assemblies.

In one embodiment, the connector support 46 includes a water mitigation feature 96. The water mitigation feature 96 is configured to close the eyelet terminal opening 40. In one embodiment, the water mitigation feature 96 includes an eyelet terminal cover 98. The eyelet terminal cover 98 is formed on the front wall 46a of the connector support 46. For illustrative purposes, the eyelet terminal cover 98 is disposed adjacent the latch mechanism 64. However, it should be appreciated that the latch mechanism 64 may be placed elsewhere in the bottom cover cavity 32 without deviating from the scope of the appended claims.

Figure 10:
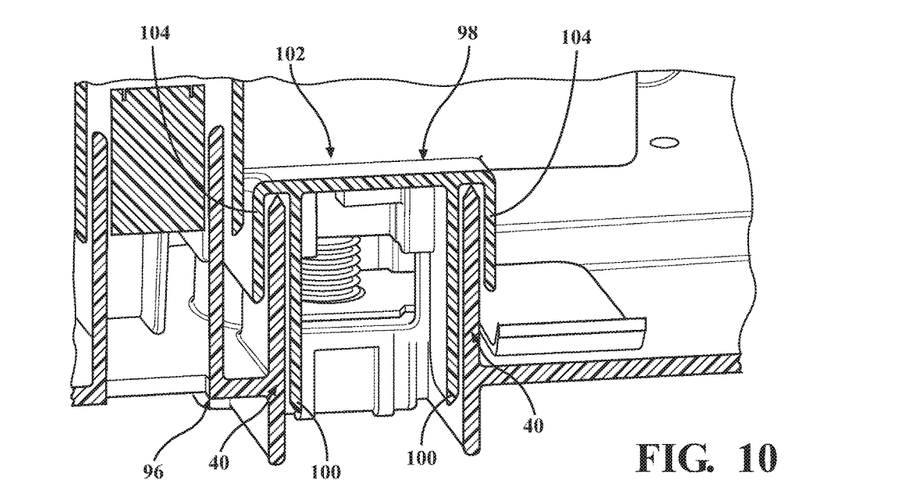
FIG. 10 is a cross-sectional view of FIG. 7 taken along line 10-10.

The eyelet terminal cover 98 includes a back support wall 84 and a pair of side support walls 100, as shown in FIG. 6. A hood 102 covers the top of the first back wall 28 and includes a pair of hood walls 104 spaced apart from respective side support walls 100 so as to fittingly receive opposite portions of the partition 42 bounding the sides of the eyelet terminal opening 40, as shown in FIG. 10. The back support wall 84 covers the eyelet terminal opening 40, as shown in FIG. 7. Accordingly, the eyelet terminal opening 40 is closed so as to prevent water from entering the bottom cover cavity 32.

Figure 15:
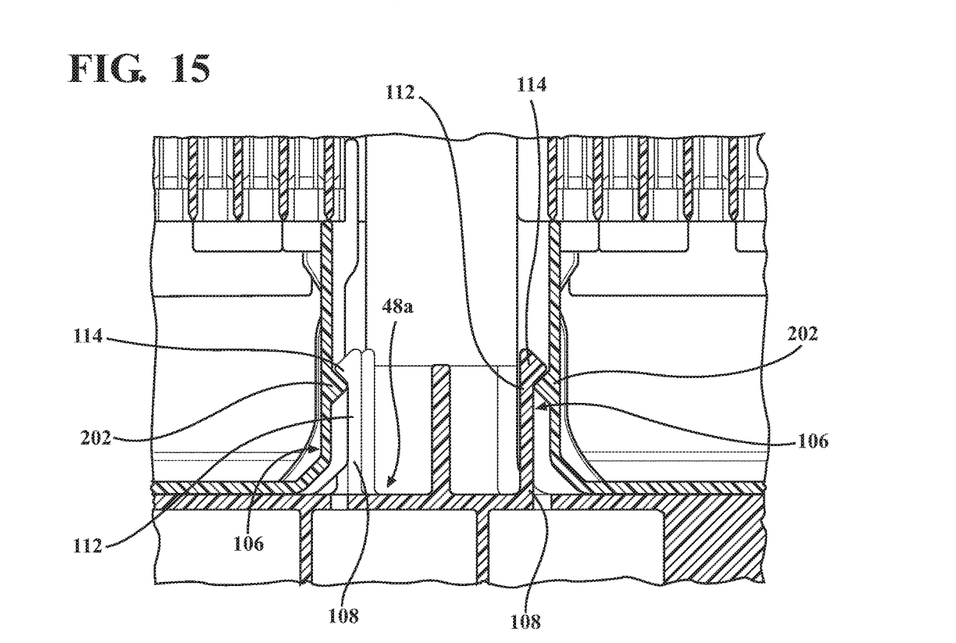
FIG. 15 is a cross-sectional view of FIG. 14 taken along line 15-15.

With reference again to FIG. 7 and also to FIGS. 14 and 15, the connector support 46 may further include a retention hook 106. The connector support 46 includes a connector wall 108 formed on the top surface 48a of the base 48 of the connector support 46. The connector wall 108 forms a connector cavity 110 configured to receive a respective connector assembly 200. The retention hook 106 is disposed along the connector wall 108.

For illustrative purposes, the connector support 46 is shown as having six retention hooks 106 for each connector cavity 110. The six retention hooks 106 are formed into three pairs, where the retention hooks 106 in a pair are axially aligned with each other along the width of the connector cavity 110. A pair of the retention hooks 106 are configured to engage a front portion of the connector assembly 200, another pair of retention hooks 106 are configured to engage a mid portion of the connector assembly 200, and the last pair of the retention hooks 106 are configured to engage a back portion of the connector assembly 200.

The retention hooks 106 are generally resilient members integrally formed to the base 48 of the connector support 46. The retention hooks 106 include a planar body 112 and a hook portion 114 formed on a distal end of the planar body. The hook portion 114 extends into the connector cavity 110. FIG. 15 shows the hook portions 114 of a pair of connector cavities engaging a lip 202 of the connector assembly 200.

Accordingly, the junction box assembly 10 provided houses a connector assembly 200 yet provides access to the bottom floor 30 of the bottom cover 16 without having to remove the connector assembly 200. The junction box assembly 10 includes a connector support 46 configured to hold a connector assembly 200.

The connector support 46 is removably attached to the bottom cover 16 and retains the connector assembly 200 so as to allow access to the bottom cover 16 without having to remove the connector assembly 200. It should be appreciated that such a design allows greater design flexibility for the bottom cover 16 to include the use of eyelet terminals 36 or any other electric components which may enhance the functionality of the junction box assembly 10.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A junction box assembly for housing a connector assembly, the junction box assembly comprising:
    a power distribution box;
    a bottom cover having a bottom cover cavity and an open top, the power distribution box dimensioned to mount onto the bottom cover so as to close the open top; and
    a connector support removably attached to the bottom cover, the connector support is configured hold the connector assembly and is dimensioned to fit within the bottom cover cavity and beneath the power distribution box, wherein the connector support includes a gripper disposed on an under surface of the connector support and the bottom cover includes a shaft, wherein the gripper is configured to grip the shaft so as to rotate the connector support about the shaft between an open position and a closed position, wherein in the open position a floor of the bottom cover is exposed.

2. The junction box assembly as set forth in claim 1, wherein the gripper includes a pair of arms, the pair of arms being resilient, the pair of arms is spaced apart from each other so as to define a slot shaft.

3. The junction box assembly as set forth in claim 2, wherein an inner surface of each of the pair of arms is arcuate.

4. The junction box assembly as set forth in claim 2, further including a stand, the stand being a generally planar member integrally formed to the bottom cover, the stand supporting the shaft above the floor of the bottom cover.

5. The junction box assembly as set forth in claim 4, wherein the stand is a plurality of stands.

6. The junction box assembly as set forth in claim 1, further including a latch mechanism configured to secure the connector support to the bottom cover when the connector support is in the closed position.

7. The junction box assembly as set forth in claim 6, wherein the latch mechanism is a resilient tab.

8. The junction box assembly as set forth in claim 7, wherein the resilient tab is disposed on a front wall of the connector support and is configured to engage a lip disposed within the bottom cover, the resilient tab may be pressed so as to release the resilient tab from the lip and free the connector support to move from the closed to the open position.

9. The junction box assembly as set forth in claim 8, wherein the bottom cover includes a key structure, the key structure is formed on a first side wall of the bottom cover, the key structure is a generally U-shaped member, the lip defining a top portion of the generally U-shaped member, and a gap disposed beneath the lip, the gap is configured to receive a portion of the resilient tab.

10. The junction box assembly as set forth in claim 1, wherein the connector support includes an open retention feature, the open retention feature is configured to keep the connector support in the open position.

11. The junction box assembly as set forth in claim 10, wherein the open retention feature includes a nub and a receiving aperture, the nub is disposed on a back wall of the connector support, and the receiving aperture is disposed on the floor of the bottom cover, the nub is registered to engage the receiving aperture in a press-fit engagement when the connector support is in the open position.

12. The junction box assembly as set forth in claim 11, wherein the nub has a ramp shaped cross-section with a planar front edge generally orthogonal to the back wall of the connector support.

13. The junction box assembly as set forth in claim 12, further including a spacer, the spacer includes a pair of legs and a support wall, the pair of legs are spaced apart from each other and are orthogonal to the back wall of the connector support, the support wall interconnecting the pair of legs wherein the nub is disposed on an outer surface of the support wall.

14. The junction box assembly as set forth in claim 1, further including a reinforcement feature configured to help prevent the connector support from detaching from the bottom cover when the connector support is in the closed position and allow the connector support to be released from the bottom cover when the connector support is in the open position.

15. The junction box assembly as set forth in claim 14, wherein the reinforcement feature includes a catch and the bottom cover includes a stop and a stand, the stand being a generally planar member integrally formed to the bottom cover, the stand supporting the shaft above the floor of the bottom cover the catch is fixedly disposed on an inner surface of an end wall, the end wall spaced apart from the gripper so as to accommodate the stand, wherein the stop is disposed on an outer surface of the stand, the catch is disposed is disposed underneath the stop when the connector support is in the closed position.

16. The junction box assembly as set for in claim 1, wherein the bottom cover includes an eyelet terminal opening and an eyelet terminal support and a water mitigation feature configured to close the eyelet terminal opening so as to prevent water from entering the bottom cover cavity.

17. The junction box assembly as set forth in claim 16, wherein the bottom cover further includes a partition bounding the eyelet terminal opening, and wherein the water mitigation feature is disposed on the connector support and includes a back support wall, a pair of side support walls and a hood, the hood covering a top of the back support wall, the water mitigation feature further including a pair of hood walls spaced apart from respective side support walls so as to fittingly receive opposite portions of the partition bounding the eyelet terminal opening.

18. The junction box assembly as set forth in claim 1, wherein the connector support includes a connector wall formed on a top surface of a base of the connector support, the connector wall defining a connector cavity configured to receive the connector assembly, a retention hook is disposed along the connector wall configured to engage the connector assembly.

* * * * *